(12) United States Patent
Eckels et al.

(10) Patent No.: US 6,289,681 B1
(45) Date of Patent: Sep. 18, 2001

(54) SUPERCONDUCTING MAGNET SPLIT CRYOSTAT INTERCONNECT ASSEMBLY

(75) Inventors: Phillip William Eckels, Florence; Richard Thomas Hackett, Sumter; Gregory F. Hayworth, Florence; Xianrui Huang, Florence; Clifford J. Ginfrida, Florence; Gregory Alan Lehmann, Florence; John Scaturro, Jr., Florence; Bu-Xin Xu, Florence, all of SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/441,897

(22) Filed: Nov. 17, 1999

(51) Int. Cl.[7] ....................................................... F17C 5/02
(52) U.S. Cl. .............................. 62/47.1; 62/51.1; 335/216
(58) Field of Search ................................. 62/45.1, 47.1, 62/51.1; 335/216

(56) References Cited

U.S. PATENT DOCUMENTS

| | | | |
|---|---|---|---|
| 4,502,296 | * | 3/1985 | Ogata et al. ........................... 62/51.1 |
| 4,510,771 | * | 4/1985 | Matsuda et al. ....................... 62/51.1 |
| 4,878,352 | * | 11/1989 | Weber et al. ........................... 62/51.1 |
| 4,959,964 | * | 10/1990 | Saho et al. ............................. 62/51.1 |
| 5,181,385 | * | 1/1993 | Saho et al. ............................. 62/51.1 |
| 5,220,800 | * | 6/1993 | Muller et al. .......................... 62/51.1 |
| 5,412,363 | * | 5/1995 | Breneman et al. .................... 62/51.1 |
| 5,568,104 | * | 10/1996 | Laskaris et al. ....................... 62/51.1 |
| 5,584,184 | * | 12/1996 | Ignaguchi et al. .................... 62/51.1 |
| 5,651,256 | * | 7/1997 | Herd et al. ............................ 335/216 |
| 5,889,456 | * | 3/1999 | Triebe et al. .......................... 62/47.1 |

* cited by examiner

*Primary Examiner*—Ronald Capossela
(74) *Attorney, Agent, or Firm*—Irving M. Freedman; Christian G. Cabou; Phyllis Y. Price

(57) ABSTRACT

A multi purpose interconnect assembly between upper and lower helium vessels in a recondensing superconducting magnet to provide isothermal connections to extend the ride-through period, and to provide for helium liquid and gas passage, electrical interconnections, and to accommodate differential thermal contraction and expansion.

20 Claims, 4 Drawing Sheets

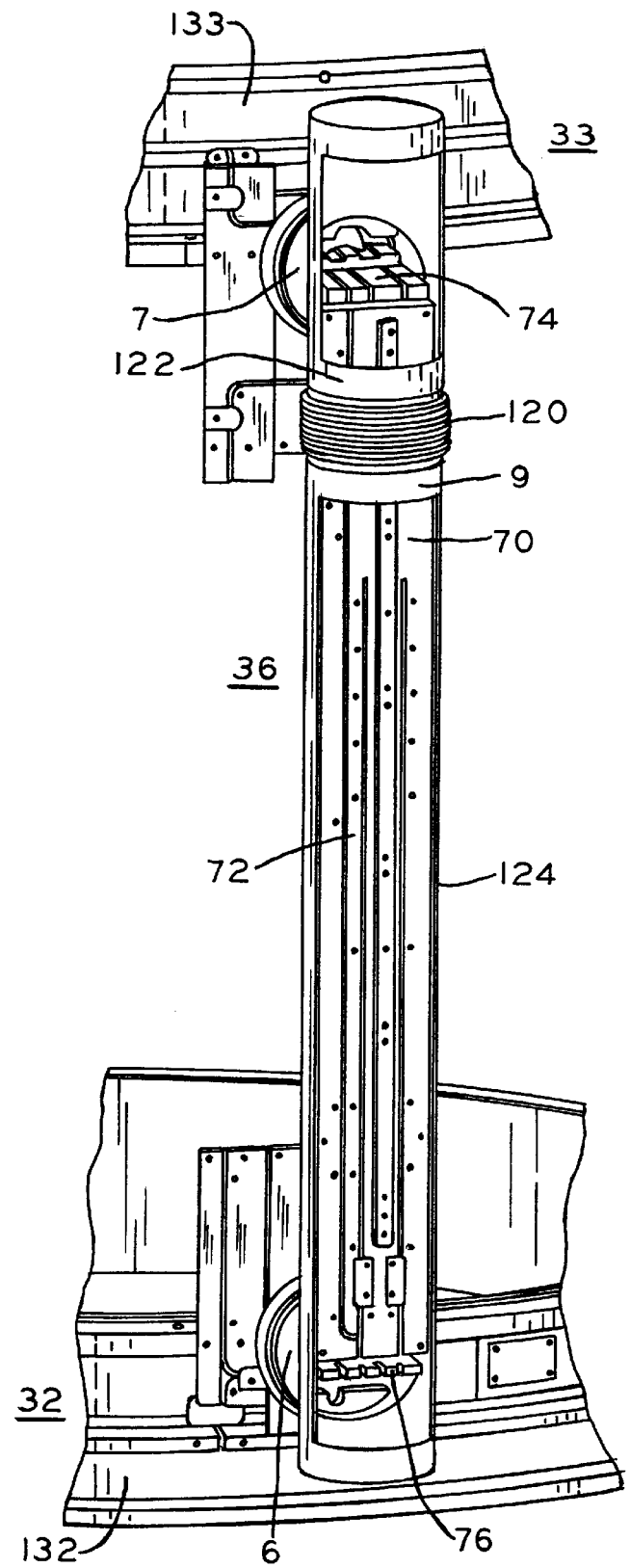
FIG_5

SUPERCONDUCTING MAGNET SPLIT CRYOSTAT INTERCONNECT ASSEMBLY

BACKGROUND OF INVENTION

This invention relates to a split cryostat superconducting magnet, and more particularly to the interconnect assembly between the magnets.

As is well known, a superconducting magnet can be made superconducting by placing it in an extremely cold environment, such as by enclosing it in a cryostat or pressure vessel containing liquid helium or other cryogen. The extreme cold ensures that the magnet coils can be made superconducting, such that when a power source is initially connected to the coil (for a relatively short period) current continues to flow through the coils even after power is removed due to the absence of resistance, thereby maintaining a strong magnetic field. Superconducting magnets find wide application in the field of Magnetic Resonance Imaging (hereinafter MRI).

Another problem encountered by conventional and early MRI equipments is that they utilize solenoidal magnets enclosed in cylindrical structures with a central bore opening for patient access. However, in such an arrangement, the patient is practically enclosed in the warm bore, which can induce claustrophobia in some patients. The desirability of an open architecture magnet in which the patient is not essentially totally enclosed has long been recognized. Unfortunately, an open architecture structure poses a number of technical problems and challenges.

One type of open architecture superconducting magnet utilizes a split dewar or split liquid helium vessels with the lower helium vessel and the upper helium vessel connected by a helium passageway or transfer tube. A helium recondenser may be connected to the upper helium vessel to receive the boiled helium gas from both vessels for recondensing back to liquid helium which is flowed into the upper helium vessel and by gravity through the vertical transfer tube in the interconnect support to the lower helium vessel. A loss of sufficient liquid helium in either vessel can cause highly undesirable quenching or discontinuance of superconducting operation of the magnet. Replenishing the liquid helium supply followed by restarting superconducting operation is expensive in terms of cost and down time of the MRI equipment. Such a loss of liquid helium can result, for example, from failure of a mechanical cryocooler associated with a helium recondenser. Cryocoolers are typically positioned in a sleeve which enables cryocooler repair or replacement without opening the helium vessel to the outside. However, replacement of the cryocooler must be made in the period after the problem is detected and before superconducting operation ceases. This period is known as the ride-through period during which the final period of superconducting magnet operation and helium boiloff continues before quenching of the superconducting magnet.

It is highly desirable to be able to extend the ride-through period to provide sufficient time for detection and correction of the problem such as by replacement of a cryocooler, and also to avoid the possibility of peak temperatures being generated by superconducting operation quench which could exceed the critical temperature of the superconducting wires with which the magnet coils are wound, resulting in magnet damage.

In addition to providing an increased ride-through period the magnet interconnect must provide adequate strength and rigidity in the presence of extreme thermal contraction and expansion encountered by the superconducting magnet and to provide suitable electrical and helium gas interconnections between the magnet coils in each of the helium vessels.

SUMMARY OF INVENTION

Thus, there is a particular need for an interconnect assembly to extend the ride through period of a superconducting magnet to provide additional time to correct the problem and avoid the aforementioned magnet quench problems, and to provide the necessary mechanical, thermal, electrical and helium interconnections.

In accordance with one form of the invention, an open recondensing architecture superconducting magnet includes an upper and lower separated cryogen vessel each including superconducting magnet coils and liquid cryogen, and separated by an interconnect assembly. The magnet is isothermalized by a layer of highly thermally conductive aluminum around the cryogen vessels and through the interconnect assembly providing a low thermal resistivity, high thermally conductive path between the cryogen vessels to conduct heat away from the cryogen vessel of higher temperature to the cryogen vessel of lower temperature. A flexible thermal joint is provided within the interconnect assembly. The isothermal members extend the ride-through period of magnet superconducting operation in the event of recondensing or other failure which results in an increase in temperature in the magnet.

More particularly the aluminum layer is RRR 1500 aluminum $\frac{1}{16}$–$\frac{1}{4}$ inch thick, the joints of which are welded for at least 50% of their length.

The high purity aluminum tube in the interconnect includes a flexible joint which in combination with a bellows on the outer stainless steel tube accommodates thermal contraction and expansion. Helium gas boiloff from the lower helium vessel is vented to the interior of the interconnect assembly for transfer to the helium gas recondenser, and a phenolic board axially extending through the interior of the interconnect assembly provides added strength to the structure and an insulated support for the superconducting wires interconnecting magnet coils of the two vessels.

DESCRIPTION OF DRAWINGS

FIGS. 4 and 5 are perspective views showing details of the interconnect assembly.

DESCRIPTION OF INVENTION

Figure 1:
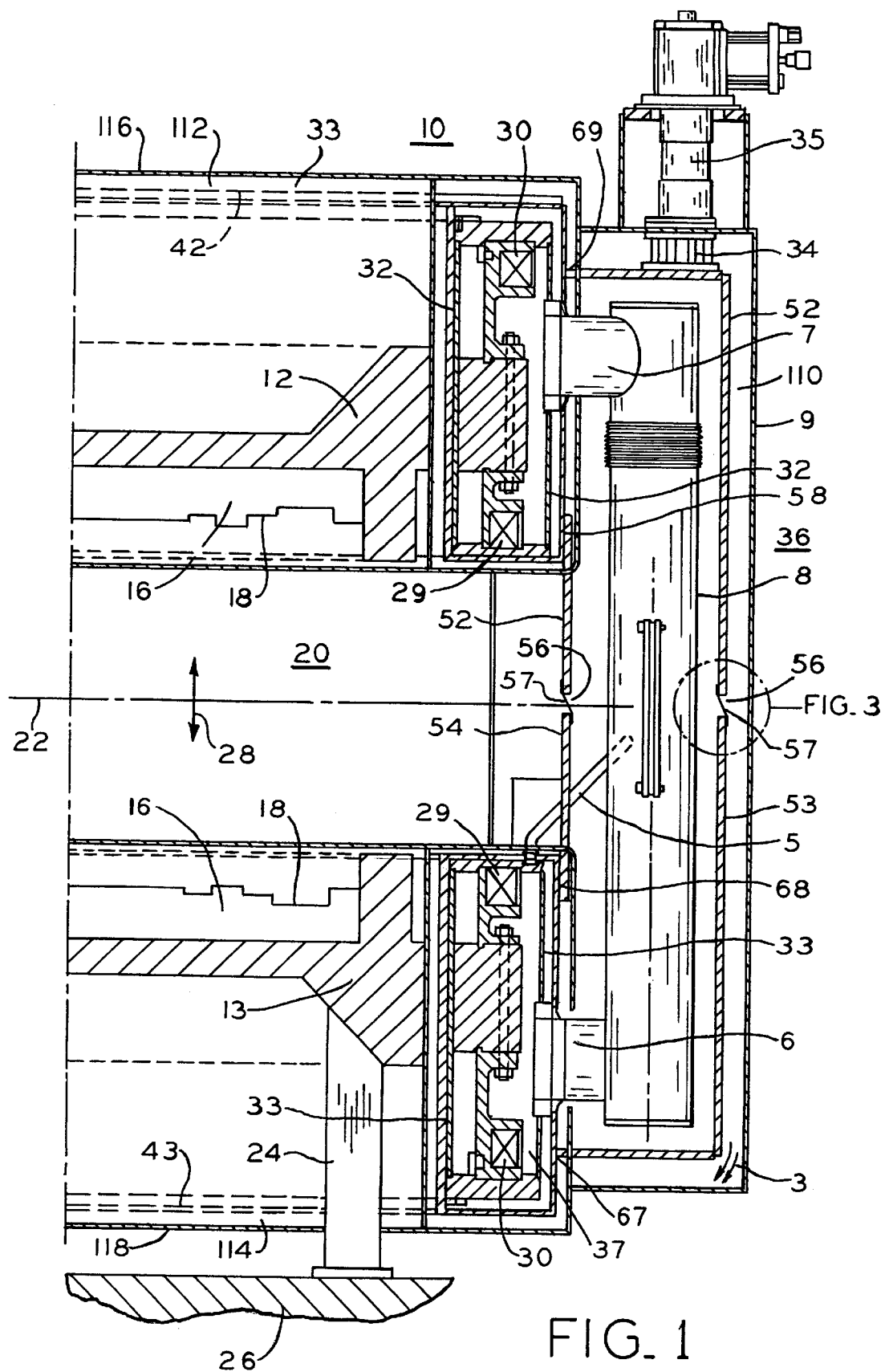
FIG. 1 is a simplified cross-sectional side view of a portion of a superconducting magnet including the subject invention.

Referring first to FIG. 1, open architecture superconducting magnet 10 includes spaced parallel pole pieces 12 and 13 separated and supported at one end by a pair of non-magnetic connecting members or posts shown generally as 14. Pole pieces 12 and 13 are of ferromagnetic material such as iron. Pole faces 16 are shaped 18 to improve magnetic field homogeneity within imaging region 20 along axis 22 of superconducting magnet 10. Supports 24 secure magnet 10 to floor 26.

The main magnetic field, Bo, indicated generally by arrow 28 within imaging region 20 is generated by magnet coils shown generally as 29 and 30 within pressure or cryogen vessels 32 and 33. Magnetic field shimming apparatus such as correction coils (not shown) within cryogen vessels 32 and 33 and/or passive shims in external shim drawers (not shown) compensate for magnetic field inhomogeneities within imaging region 20 in the manner well known in the art. liquid helium shown generally as 37 is a suitable cryogen for use in cryogen or helium vessels 32 and 33. Recondenser 34 and associated mechanical cryocooler 35 (which may be a two stage Gifford-McMahon cryocooler) may be connected to upper helium vessel 32 to recondense helium gas which results from the superconducting operation back to liquid helium. The recondensed liquid helium flows from recondenser 34 by gravity into upper helium vessel 32.

Figure 4:
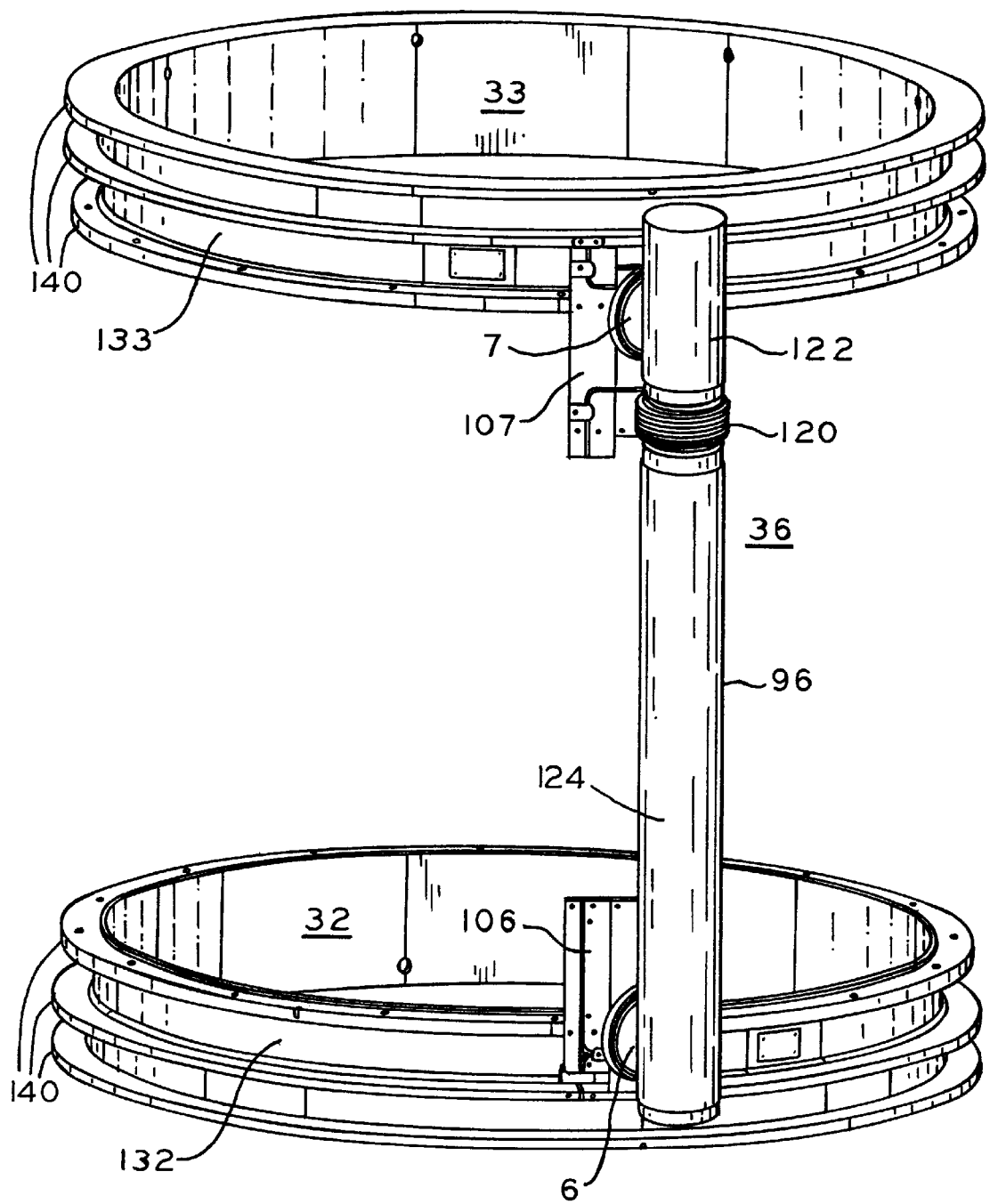

As best shown in FIGS. 1, 4 and 5, interconnect assembly 36 connects helium vessels 32 and 33 through cryogen tube 8 which connects to helium vessel 32 through bimetal transition flange or nozzle 7 and to helium vessel 33 through bimetal nozzle 6 to helium vessel 33. Bimetal nozzles 6 and 7 enable suitable welding between the joined components in a maimer well known in the art. Cryogen tube 8 enables the flow of liquid helium from upper helium vessel 32 to lower helium vessel 33 and also the upward passage of helium gas from lower helium vessel 33 to recondenser 34.

Helium gas generated by liquid helium cooling and boiloff within lower helium vessel 32 flows through helium gas flow vent 5 which interconnects the lower helium vessel and the interior of stainless steel cryogen tube 8 to provide helium gas venting and recondensing by recondenser 34 during normal operation of superconducting magnet 10, and especially during superconducting magnet ramping up to superconducting operation during which there is a large amount of helium boiloff gas.

As best shown in FIG. 5, phenobic board 70 extends through the center of cryogen tube 8 and supports interconnect tubes such as 72 which carry interconnecting superconducting wires which connect magnet coils 29 and 30 in lower helium vessel 33 in series with coils 29 and 30, respectively in upper helium vessel 32. Phenolic boards provide both strength to the interconnect assembly 36 and insulation for the superconducting wires carried by the phenolic board. Connections to the interior of the upper and lower helium vessels pass through connector assembly 74 within bimetal joint 7 to upper helium vessel 33, and through connector assembly 76 within bimetal joint 6 to lower helium vessel 33.

The structural connections between interconnect 36 and coil support structures 132 and 133 within helium vessels 32 and 33 are best shown in FIGS. 4 and 5. Referring to FIGS. 4 and 5 it is seen that stainless steel outer cylinder 122 of interconnect 36 is connected through bimetal nozzles 7 and 6, to upper helium vessel 33 and lower helium vessel 32, respectively. Supports 107 and 106 are bolted to structural rings 140 of coil support structures 132 and 133.

Space 110 between high purity aluminum cylinder 52, 56, 53 and outer stainless steel cylinder 9 of interconnect assembly 36 is evacuated and connects to the evacuated space 112 and 114 within outer vacuum vessels 116 and 118 surrounding helium vessels 32 and 33, respectively (see FIG. 1).

In order to accommodate the differential thermal contraction and expansion cycles between the various materials including aluminum and stainless steel in superconducting magnet 10 including interconnect 36 and upper helium vessel 33 and lower helium vessel 32, bellows 120 is interposed between upper portion 122 and lower portion 124 of stainless steel outer cylinder 9 of the interconnect assembly. Bellows 120 absorbs the shrinkage of cylinder or shield 9 during cool-down of superconducting magnet 10 to superconducting temperatures.

Upper helium vessel 32 and lower helium vessel 33 are high strength structural aluminum such as AL5083 with cylinders and flanges having thicknesses which vary from 0.3 to 2.6 inches thick with welded seams. Structural aluminum or other materials such as stainless steel are not highly conductive or adequate thermal conductors in the presence of the strong magnetic fields generated by magnet coils 29 and 30 during superconducting operation of superconducting magnet 10. Thermal conductivity drops in the presence of strong magnetic fields.

Highly thermally conductive layers of aluminum 42 and 43 are applied to cryogen vessels 32 and 33, respectively. A suitable aluminum is RRR 1500 which has an RRR (Residue Resistivity Ratio) which provides a thermal conductivity of ~5700 W/m/K where W=watts, m=meters and K=degrees Kelvin. Highly thermally conductive aluminum layers on helium vessels 32 and 33 are $\frac{1}{8}$" thick although thickness of $\frac{1}{16}$–$\frac{1}{4}$" thick are suitable depending on the factors such as the thermal conductivity and the completeness of the coverage of the layers. Access ports for items such as power and test leads are not readily covered by high thermally conductive layers such that the number and size of such uncovered areas may lead to the desirability of thicker aluminum layers to provide the desired or required thermal conductivity.

Figure 2:
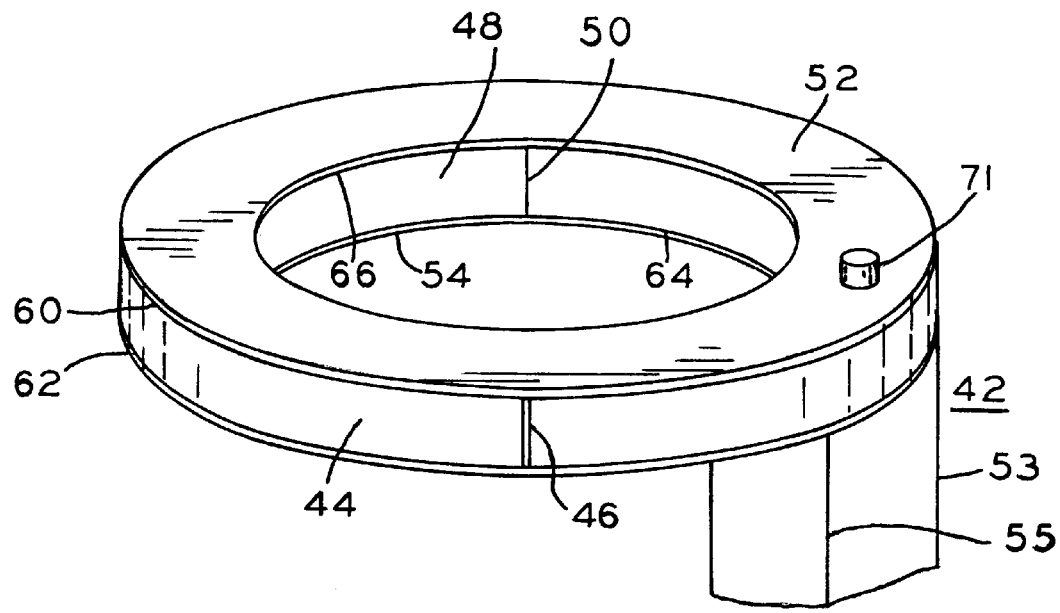
FIG. 2 is a simplified, enlarged and expanded view of a portion of FIG. 1 showing details of the welded seams of the isothermal structure.

As best shown in FIG. 2, seams in the high thermally conductive aluminum layers are butted and welded along 50% or more of the length of the seams, and the aluminum layers may be welded to cryogen vessels 32 and 33, respectively. FIG. 2 shows the welded seams. Referring to FIG. 2, it is seen that aluminum layer 42 around helium vessel 32 is conveniently fabricated of four basic portions. A pair of concentric generally hollow cylindrical portions 44 and 48 meeting at butt joints such as seam 46 on the outer cylinder 48 and seam 50 on the inner cylinder 48. A pair of round washer shaped portions 52 and 54 cover the open upper and lower ends of the concentric cylinders 44 and 48. Access ports for power and test purposes, for example, would pass through one or more of layers 44, 48, 52 and 54. Access port 71 is shown by way of example as an opening through a portion or layer 52 to enable access through the layer and cryogen vessel 32 to the interior of the cryogen vessel 32 for electrical power leads and for test purposes.

The butt joints between layers 44, 48, 52 and 54 are welded with the welds extending 50% or more along the length of each joint. In addition to joints 46 and 50, there are joints 60, 62, 64 and 66 between washer shaped portions 52 and 54 and cylinders 44 and 48 providing layer 42 around cryogen vessel 32. The welding may bond or weld the layers to the cryogen vessel in addition to welding the seams or joints of the layers 44, 48, 52 and 54.

As best shown in FIG. 1, internal to interconnect assembly 36 are high purity highly thermally conductive vertical isothermalizing cylinders 52 and 53 which connect to isothermalizing cylinders 32 and 33 and are separated at joint 56. High purity aluminum cylinder 52 is welded to high purity aluminum cylinder 32 at joints 69 and 58. High purity aluminum cylinder 53 is similarly welded to high purity aluminum 23 at joints 67 and 68 providing a continuous high purity aluminum isothermal path between cylinders 32 and 33 with the exception of joint 56 in the central region of cylinders 52 and 53. Joint 56 is bridged by a high conductivity flexible bridge best shown in FIG. 3.

Figure 3:
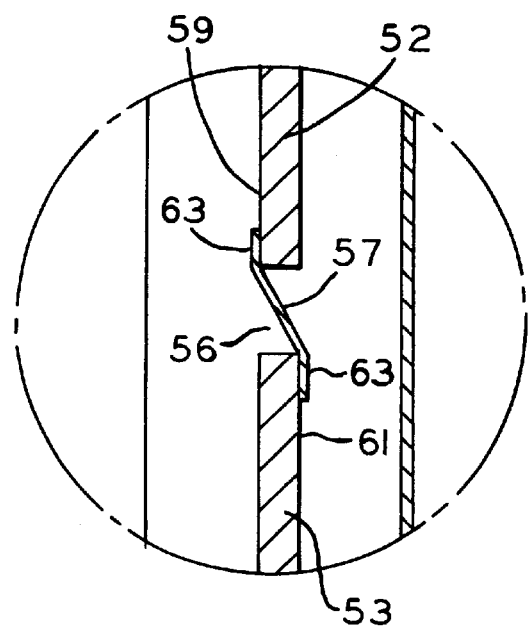
FIG. 3 is an enlarged view of the flexible joint for the isothermal structure shown in to FIGS. 1 and 2.

Referring to FIG. 3, joint 56 between high thermally conductive cylinders 52 and 53 is comprised of flexible high conductivity high purity aluminum bridging material 57 which extends from the exterior 59 of cylinder 52 through gap 56 to the interior 61 of cylinder 53. Bridging material 57 overlaps and is welded 63 to the exterior 59 of cylinder 52 and the interior 61 of cylinder 53. Bridging material 57 is composed of a number of flexible joints that are S-shaped laminates of high conductivity aluminum sheets and is flexible and accommodates the relative movement of cylinders 52 and 53 during cooldown or quenching of superconducting magnet 10 because of differential thermal expansion of the various materials included in vessels 32 and 33 and interconnect assembly 36.

Super insulation or multi-layer blankets (a portion of which is shown as 3 in FIG. 1) of alternating aluminized mylar and thermal insulation are positioned between outer vacuum vessel 9 and high conductivity thermal cylinder or shield 52, 56, 32 in evacuated space 110.

RRR 1500 aluminum has a thermal conductivity of ~5700 W/m/K at 4 K and 0 field. When placed in a field of 1.5 Tesla, its conductivity drops to ~2100 W/mK, which is still 3 orders or magnitude higher than the commonly use structural aluminum alloy such as AL5083 commonly used to provide the necessary structural strength for pressure helium vessels 32 and 33. The high purity aluminum cylinders 42 and 43 applied around and to helium vessels 32 and 33 reduce heat conduction resistance between the helium vessels and keep the peak temperature at less than 5.2 K when there is only a small amount of liquid helium available in the vessel to keep the bottom of the vessel at 4.24 K (liquid helium temperature). Without the high purity aluminum interconnection, the peak temperature would more quickly be greater than 12 K, possibly exceeding the critical temperature of the superconducting magnet wires of magnet coils 30 which cold severely damage the wires and superconducting magnet 10.

The discontinuance of superconducting operation of magnet coils 30 within either helium vessel 32 or 33 would render superconducting magnet 10 unstable and unsuitable for MRI imaging, and the quenching and magnetic field collapsing of either helium vessel can adversely affect and hasten quenching of coils 30 within the other vessel. There is thus a need to maintain all of coils 30 superconducting for as long as possible to lengthen the ride-through period of superconducting operation and provide adequate time for repairs such as by replacement of cryocooler 35.

Thus, with the helium volumes in both helium vessels 32 and 33 being equal at zero time ($T_0$) of failure of a recondenser; for example, recondenser 34, continued superconducting operation will cause continued boiling of helium 46 in both helium vessels. As helium gas increases without any or adequate recondensing back to liquid helium, the liquid helium level will begin to fall in upper helium vessel 32. In the case of a single recondenser 34 cryocooler 35 combination, the total helium boiloff would be from both helium vessels 32, 33 with the boiloff in lower helium vessel 33 being replaced by gravity flow of liquid helium 46 from upper helium vessel 32 through tubing or pipe 37 to attempt to maintain lower helium vessel 33 full. That is, the helium level volume in upper helium vessel 32 could substantially decrease at the rate of approximately twice the boiloff of either helium vessel.

The additional time provided by the continued superconducting operation of coils 30 within both helium vessels 32 and 33 because of the isothermalizing described above is important to enable the servicing and/or replacement or cryocooler 35 and/or other repairs, followed by the resumption of the recondensing action of recondenser 34 to recondense and convert accumulated helium gas back to liquid helium. This in turn enables the resumption of normal superconducting operation of superconducting magnet 10. The isothermal connections will also extend the ride-through period for superconducting magnets which utilize a separate recondenser for each of helium vessels 32 and 33 in the event of failure of recondensing action of either recondenser in such a system. Liquid helium could also be added to superconducting magnet 10 at this time if required.

It is thus seen that interconnect assembly 36 is relatively uncomplex yet provides solutions to a plurality of interconnect problems, some of which are in conflict including the provision of superconducting thermal joints and electrical connections; a flow path for liquid helium and helium gas between the helium vessels and recondenser to handle the variety of operational conditions included cool-down and quenching; an isothermal path to prolong ride-through operation and to limit temperature gradients between the two magnets; and accommodation for superconducting wires cool-down shrinkage.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. An open architecture recondensing cryogen superconducting magnet system including an upper and lower cryogen vessel each including superconducting magnet coils and a liquid cryogen to provide a magnetic field therebetween, and at least one support and interconnect assembly between the vessels, thermal apparatus to prolong superconducting ride-through operation comprising:

a recondenser to recondense cryogen gas back to liquid cryogen connected to at least one of said cryogen vessels;

said thermal apparatus including:
a first layer of highly thermally conductive material around said upper cryogen vessel;
a second layer of highly thermally conductive material around said lower cryogen vessel;
said interconnect assembly between said upper and lower vessels including a highly thermally conductive material thermally connecting said first and second layers of highly thermally conductive material;
said highly thermally conductive material providing a thermal path for isothermalizing said upper cryogen vessel and said lower cryogen vessel and conducting heat away from the higher temperature cryogen vessel to the lower temperature cryogen vessel to prolong the superconducting ride-through period.

2. The isothermal open architecture recondensing magnet system of claim 1 wherein said thermally conductive material is high purity aluminum.

3. The isothermal open architecture recondensing magnet system of claim 2 wherein a flexible thermal joint is interposed in said connecting material within said interconnect assembly, said joint including multiple layers of highly thermally conductive material.

4. The isothermal open architecture recondensing magnet system of claim 3 wherein said flexible joint includes S-shaped aluminum sheet laminates to reduce the heat conduction resistance through said flexible joint and to enhance heat transfer from the warmer cryogen vessel to the cooler cryogen vessel to provide said isothermal operation and ride-through period extension upon an operational event causing, a rise in temperature of said warmer cryogen vessel.

5. The isothermal open architecture recondensing magnet system of claim 4 wherein said aluminum is high purity RRR 1500 aluminum, $\frac{1}{16}$ to $\frac{1}{4}$ inch thick.

6. The isothermal open architecture recondensing magnet system of claim 4 wherein said magnet system includes a recondenser, said interconnect assembly includes a cryogen tube to provide a flow path for liquid and gas helium between said vessels, and said highly thermally conductive material of said interconnect assembly surrounds said cryogen tube.

7. The isothermal open architecture superconducting magnet system of claim 6 wherein said connecting material forms an inner cylinder and an outer cylinder surrounds said inner cylinder with an insulating blanket therebetween.

8. The isothermal open architecture recondensing magnet system of claim 6 wherein said upper cryogen vessel is connected to a cryocooler and recondenser and said outer cylinder includes a bellows intermediate the ends thereof to accommodate differential thermal changes in dimensions.

9. The isothermal open architecture recondensing magnet system of claim 6 wherein said layers of aluminum meet at joints which are welded along at least 50% of their length.

10. The isothermal open architecture recondensing magnet system of claim 4 wherein said interconnect assembly includes internal axially extending superconductor wires carried on a phenolic board to interconnect the magnet coils in said upper and lower vessels.

11. The isothermal open architecture recondensing magnet system of claim 2 wherein said high purity aluminum layer surrounds a substantial portion of said vessels.

12. An isothermal open architecture superconducting magnet system including an upper and lower separated cryogen vessel each including superconducting magnet coils and a liquid cryogen to provide a magnetic field therebetween, isothermalizing apparatus to prolong superconducting ride-through operation comprising:

a high purity thermally conductive aluminum layer around said upper cryogen vessel;

a high purity thermally conductive aluminum layer around said lower cryogen vessel;

an interconnect assembly including a high thermally conductive path between the aluminum layers to provide isothermal operation of the cryogen vessels;

whereby isothermalizing heat flow between said cryogen vessels is facilitated to extend said superconducting ride-through operation.

13. The isothermal superconducting magnet system of claim 12 wherein said layers of high purity thermally conductive aluminum meet at joints which are welded together along at least 50% of their length.

14. The isothermal superconducting magnet system of claim 12 wherein said layers are welded to said cryogen vessels.

15. The isothermal superconducting magnet system of claim 13 wherein said interconnect assembly includes an outer vacuum vessel with a bellows intermediate the ends thereof to accommodate differential temperature changes.

16. The isothermal superconducting magnet system of claim 15 wherein said interconnect assembly further includes an axially extending phenolic board to carry superconducting interconnections between said superconducting magnet coils in said upper and lower vessels.

17. The isothermal superconducting magnet system of claim 15 wherein said outer vacuum vessel is connected through bimetal transition nozzles to said upper and lower vessels and said superconducting interconnections provide electrical and helium connections between said vessels.

18. The isothermal superconducting magnet system of claim 17 wherein said superconducting magnet system includes a helium gas recondenser, and a helium gas passage interconnects said lower cryogen vessel and the interior of said interconnect assembly to provide a gas flow path leading to said recondenser.

19. The isothermal superconducting magnet system of claim 13 wherein said aluminum layers are RRR 1500 aluminum, $\frac{1}{16}$ to $\frac{1}{4}$ inches thick.

20. The isothermal superconducting magnet system of claim 12 wherein said conductive path includes a flexible joint intermediate said cryogen vessels.

* * * * *